(12) United States Patent
Cheng et al.

(10) Patent No.: US 12,089,431 B2
(45) Date of Patent: Sep. 10, 2024

(54) DISPLAY PANEL, MANUFACTURING METHOD THEREOF, AND DISPLAY DEVICE

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Bo Cheng, Beijing (CN); Xiangdan Dong, Beijing (CN); Jun Yan, Beijing (CN); Mengmeng Du, Beijing (CN); Shuangbin Yang, Beijing (CN)

(73) Assignees: CHENGDU BOE OPTOELECTRONICS TECHNOLOGY CO., LTD., Chengdu (CN); BOE TECHNOLOGY GROUP CO., LTD., Beijing (CN)

( * ) Notice: Subject to any disclaimer, the term of this patent is extended or adjusted under 35 U.S.C. 154(b) by 196 days.

(21) Appl. No.: 16/981,853

(22) PCT Filed: Nov. 1, 2019

(86) PCT No.: PCT/CN2019/115060
§ 371 (c)(1),
(2) Date: Sep. 17, 2020

(87) PCT Pub. No.: WO2021/081987
PCT Pub. Date: May 6, 2021

(65) Prior Publication Data
US 2021/0273198 A1    Sep. 2, 2021

(51) Int. Cl.
*H10K 59/122*  (2023.01)
*H10K 50/84*   (2023.01)
*H10K 59/131*  (2023.01)
*H10K 71/00*   (2023.01)

(52) U.S. Cl.
CPC .......... *H10K 50/84* (2023.02); *H10K 59/122* (2023.02); *H10K 59/131* (2023.02); *H10K 71/00* (2023.02)

(58) Field of Classification Search
CPC ...... H01L 51/5237; H01L 2224/83501; H05K 2201/09909
See application file for complete search history.

(56) References Cited

U.S. PATENT DOCUMENTS 6,266,121 B1   7/2001   Shigeta et al.
9,859,334 B2   1/2018   Kim et al.
(Continued)

FOREIGN PATENT DOCUMENTS

CN   205900544 U    1/2017
CN   107437554 A   12/2017
(Continued)

OTHER PUBLICATIONS

Extended European Search Report from European Application No. 19945441.4 dated Oct. 7, 2022.
(Continued)

*Primary Examiner* — Vu A Vu
*Assistant Examiner* — Valerie N Newton
(74) *Attorney, Agent, or Firm* — Dilworth & Barrese, LLP.; Michael J. Musella, Esq.

(57) ABSTRACT

A display panel, a manufacturing method thereof, and a display device. The display panel includes a base substrate, a first block portion, an encapsulation layer and a touch signal line. The first block portion is located in the peripheral region, the first block portion includes a first block layer and a second block layer; the encapsulation layer covers the first block portion; the touch signal line is located on the encapsulation layer and covers a part of the first block portion. The first block layer includes a first sub-block portion and a (Continued)

second sub-block portion. The second sub-block portion is located between the first sub-block portion and the second block layer, a maximum size of the second sub-block portion is not greater than a minimum size of the first sub-block portion.

20 Claims, 4 Drawing Sheets

(56) References Cited

U.S. PATENT DOCUMENTS

| | | |
|---|---|---|
| 2010/0258346 A1 | 10/2010 | Chen et al. |
| 2018/0366520 A1 | 12/2018 | Gwon et al. |
| 2019/0196619 A1 | 6/2019 | Baek |
| 2021/0234122 A1* | 7/2021 | Choi .................. H01L 27/3258 |

FOREIGN PATENT DOCUMENTS

| | | |
|---|---|---|
| CN | 108874256 A | 11/2018 |
| CN | 109088009 A | 12/2018 |
| CN | 110058712 A | 7/2019 |
| CN | 110112306 A | 8/2019 |
| CN | 110137385 A | 8/2019 |
| CN | 110277508 A | 9/2019 |

OTHER PUBLICATIONS

Chinese Office Action mailed Jun. 29, 2024 in Application No. 201980002256.7.

* cited by examiner

DISPLAY PANEL, MANUFACTURING METHOD THEREOF, AND DISPLAY DEVICE

TECHNICAL FIELD

At least one embodiment of the present disclosure relates to a display panel, a manufacturing method thereof, and a display device.

BACKGROUND

An organic light-emitting display device includes a base substrate and a plurality of pixels including light-emitting elements formed on the base substrate, and an encapsulation layer covering the pixels is provided on the pixels. The encapsulation layer includes an inorganic insulation layer and an organic insulation layer. The organic light-emitting display device includes a display region and a peripheral region surrounding the display region. The peripheral region is provided with a block component to prevent a fluid material forming the organic insulation layer from overflowing the base substrate during forming the organic insulation layer in the encapsulation layer.

SUMMARY

At least one embodiment of the present disclosure provides a display panel, a manufacturing method thereof and a display device.

At least one embodiment of the present disclosure provides a display panel, including: a base substrate, a first block portion, an encapsulation layer and a plurality of touch signal lines. The base substrate includes a display region and a peripheral region located at a periphery of the display region; the first block portion is located in the peripheral region, and a first part of the first block portion located on a side of the display region extends in a first direction parallel to the base substrate, and the first block portion includes a first block layer, a second block layer located on a side of the first block layer away from the base substrate, and a third block layer located on a side of the second block layer away from the first block layer; the second block layer covers a surface of the first block layer away from the base substrate and a side face of the first block layer, and the third block layer covers a surface of the second block layer away from the base substrate and a side face of the second block layer; an encapsulation layer is located in the display region and the peripheral region, and covers the first block portion; a plurality of touch signal lines are located on a side of the encapsulation layer away from the base substrate and extend in a second direction intersecting with the first direction, and an orthographic projection of the plurality of touch signal lines on the base substrate overlaps with an orthographic projection of the first part of the first block portion on the base substrate. The first block layer includes a first sub-block portion and a second sub-block portion with a same material, and the second sub-block portion is located between the first sub-block portion and the second block layer; in the first part of the first block portion, a maximum size of the second sub-block portion in the second direction is not greater than a minimum size of the first sub-block portion in the second direction, so that an inclination angle of a first slope formed on a surface of the encapsulation layer away from a junction position of the first sub-block portion and the second sub-block portion is approximately in a range from 20° to 35°.

In some examples, the inclination angle of the first slope is approximately in a range from 27° to 33°.

In some examples, a cross-section of the first block layer in the first part of the first block portion taken by a plane perpendicular to the first direction has a shape of trapezoid, and a first included angle between a first oblique side included in the trapezoid and the base substrate is approximately in a range from 20° to 35°.

In some examples, in the first part of the first block portion, the second block layer covers a surface of the first block layer away from the base substrate and a side face of the first block layer, and the third block layer covers a surface of the second block layer away from the first block layer and a side face of the second block layer.

In some examples, the peripheral region includes a bonding region, and the first part of the first block portion is located on a side of the display region close to the bonding region.

In some examples, the plurality of touch signal lines cover a part of the first slope so that a surface of the plurality of touch signal lines away from the first slope forms a second slope.

In some examples, the first block portion is a ring structure surrounding the display region, and in a second part of the first block portion except the first part, a maximum size of the second sub-block portion in a fourth direction intersecting with an extending direction of the second part is not greater than a minimum size of the first sub-block portion in the fourth direction, so that a third slope is formed on a surface of the encapsulation layer away from the junction position of the first sub-block portion and the second sub-block portion, and an inclination angle of the third slope is approximately in a range from 20° to 35°.

In some examples, the first sub-block portion and the second sub-block portion are integrally formed.

In some examples, in the first part of the first block portion, a center line of an orthographic projection of the second sub-block portion on the base substrate in the first direction is substantially coincident with a center line of an orthographic projection of the first sub-block portion on the base substrate in the first direction.

In some examples, a center line of an orthographic projection of the second block layer on the base substrate in the first direction is substantially coincident with the center line of the second sub-block portion.

In some examples, the display panel further includes: a second block portion, located in the peripheral region and located between the first block portion and the display region, the second block portion and the first block portion extend in a same direction, and in a third direction perpendicular to the base substrate, a size of the first block portion is greater than a size of the second block portion.

In some examples, a cross-section of the second block portion taken by a plane perpendicular to the extending direction of the second block portion includes a second oblique side, and an absolute value of a difference between a second included angle between the second oblique side and the base substrate, and the inclination angle of the first slope, is greater than 0° and less than 20°.

In some examples, the second block portion includes a fourth block layer and a fifth block layer located on a side of the fourth block layer away from the base substrate, the fourth block layer and the second block layer are provided in a same layer and have a same material and a same thickness, and the fifth block layer and the third block layer are provided in a same layer and have a same material and a same thickness.

In some examples, the display panel further includes a pixel circuit structure layer located in the display region; a planarization layer located on a side of the pixel circuit structure layer away from the base substrate; and a light-emitting element located on a side of the planarization layer away from the pixel circuit structure layer. The first block layer and the planarization layer are provided in a same layer, and have a same thickness and a same material.

In some examples, the display panel further includes a pixel definition layer located on a side of the planarization layer away from the pixel circuit structure layer. The second block layer and the pixel defining layer are provided in a same layer, and have a same thickness and a same material.

In some examples, in a third direction perpendicular to the base substrate, a ratio of a size of the first sub-block portion to a size of the second sub-block portion is approximately in a range from 0.8 to 1.2.

In some examples, in the third direction, a size of the first block layer is approximately in a range from 1.6 microns to 2.5 microns.

In some examples, in the third direction, a size of the first block portion is approximately in a range from 3 microns to 5 microns.

In some examples, a size of the first sub-block portion in the second direction is approximately in a range from 25 microns to 45 microns.

In some examples, in the second direction, a difference between the size of the first sub-block portion and the size of the second sub-block portion is 20%~30% of the size of the first sub-block portion.

At least one embodiment of the disclosure provides a manufacturing method of a display panel, including: providing a base substrate, the base substrate including a display region and a peripheral region located at a periphery of the display region; forming a first block portion in the peripheral region of the base substrate, wherein a first part of the first block portion extends in a first direction parallel to the base substrate, forming the first part of the first block portion includes: forming a first block layer material on the base substrate; forming a first sub-block portion and a second sub-block portion which are stacked by performing one patterning process on the first block layer material, the second sub-block portion being located on a side of the first sub-block portion away from the base substrate, and in a second direction intersecting with the first direction, a maximum size of the second sub-block portion being not greater than a minimum size of the first sub-block portion; forming a second block layer on a side of the second sub-block portion away from the base substrate; forming a third block layer on a side of the second block portion away from the first block portion; forming an encapsulation layer located in the display region and the peripheral region on a side of the first block portion away from the base substrate, the encapsulation layer covering the first part of the first block portion to form a first slope on a surface of the encapsulation layer at a junction position of the first sub-block portion and the second sub-block portion and away from the base substrate, and an inclination angle of the first slope being approximately in a range from 20° to 35°; and forming a plurality of touch signal lines extending in the second direction on a surface of the encapsulation layer away from the base substrate, the plurality of touch signal lines covering a part of the first slope.

In some examples, forming the first sub-block portion and the second sub-block portion which are stacked by performing the one patterning process includes: forming the first sub-block portion and the second sub-block portion by a half-tone mask.

In some examples, the half-tone mask includes a completely light-transmitting region, a partial light-transmitting region, and a non-light-transmitting region, forming the first sub-block portion and the second sub-block portion includes: placing the non-light-transmitting region of the half-tone mask directly opposite to a region where the second sub-block portion is to be formed in the first block layer material, placing the partial light-transmitting region of the half-tone mask directly opposite to a region to form a portion of the first sub-block portion other than a portion overlapping with the region to form the second sub-block portion, and placing the completely light-transmitting region of the half-tone mask directly opposite to a region other than the region where the first sub-block portion is to be formed, and then exposing the first block layer material; developing and curing the first block layer material to form the first sub-block portion and the second sub-block portion.

At least one embodiment of the disclosure provides a display device including the above mentioned display panel.

BRIEF DESCRIPTION OF THE DRAWINGS

In order to clearly illustrate the technical solution of the embodiments of the disclosure, the drawings of the embodiments will be briefly described in the following; it is obvious that the described drawings are only related to some embodiments of the disclosure and thus are not limitative of the disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first," "second," etc., which are used in the present disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects.

Figure 1A:
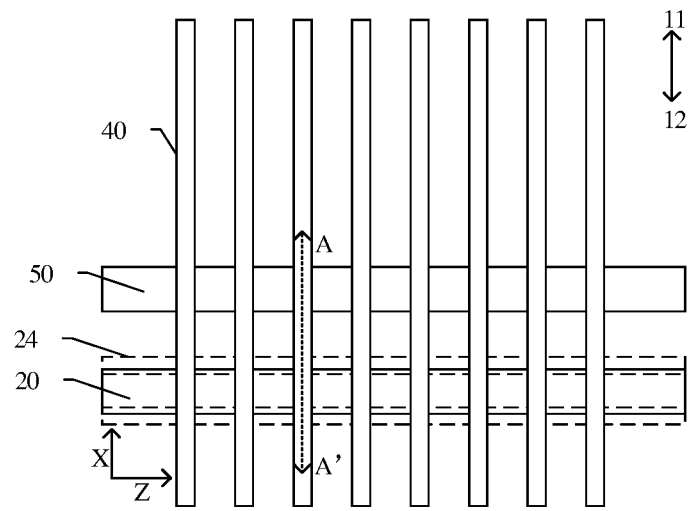
FIG. 1A is a schematic diagram of a partial plane structure of a display panel.
Figure 1B:
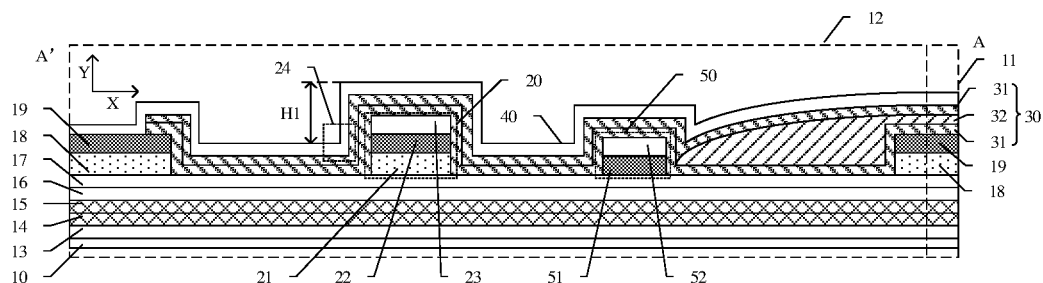
FIG. 1B is a schematic diagram of a cross-section taken along a line AA' in FIG. 1A.

FIG. 1A is a schematic diagram of a partial plan structure of a display panel, and FIG. 1B is a schematic diagram of a cross-section taken along a line AA' in FIG. 1A. As shown in FIGS. 1A and 1B, the display panel includes a display region 11 and a peripheral region 12 located in a periphery of the display region 11. The peripheral region 12 can surround the display region 11 or can be located in a part of the periphery of the display region 11. FIGS. 1A and 1B illustrate a plan diagram and cross-section diagram of a part of film layers in the peripheral region 12 of the display panel.

As shown in FIGS. 1A and 1B, the peripheral region 12 of the display panel can include a base substrate 10, and a buffer layer 13, a first gate insulation layer 14, a second gate insulation layer 15, an interlayer insulation layer 16, a source-drain metal layer 17, a planarization layer 18 and a pixel definition layer 19 sequentially located on the base substrate 10. The source-drain metal layer 17 described above corresponds to a source electrode and drain electrode of a thin film transistor (not shown) of a pixel circuit structure and a data line in the display region 11. The planarization layer 18 in the display region 11 is provided on the thin film transistor, and a light-emitting element (not shown) is further provided on a side of the planarization layer 18 in the display region 11 away from the base substrate 10. The light-emitting element can include a light-emitting function layer, and a first electrode and a second electrode on both sides of the light-emitting function layer. The first electrode on a side of the light-emitting function layer close to the base substrate 10 can be electrically connected to the drain electrode of the thin film transistor through a via hole provided in the planarization layer 18. The pixel definition layer 19 is provided on a side of the first electrode away from the base substrate 10 to facilitate forming the light-emitting function layer. The light-emitting function layer can include a light-emitting layer, and can further include other function layers, for example, it can further include at least one of a hole injection layer, a hole transport layer, an electron transport layer, and an electron injection layer, and it is not limited thereto. The encapsulation layer 30 is provided on a side of the light-emitting element away from the base substrate 10, and the encapsulation layer 30 covers the light-emitting element to prevent the light-emitting element from being corroded by external water and oxygen, to have a function of protecting the light-emitting element. The encapsulation layer 30 includes an inorganic layer 31 and an organic layer 32 stacked in sequence. FIG. 1B illustrates that the encapsulation layer 30 includes two inorganic layers 31 and one organic layer 32 between the two inorganic layers 31.

As shown in FIGS. 1A and 1B, the peripheral region 12 is provided with a first block portion 20 and a second block portion 50 located on a side of the first block portion 20 close to the display region 11. The two block portions can be located on the source-drain metal layer 17 to prevent the organic layer 32 in the encapsulation layer 30 from overflowing the base substrate 10 during the manufacture process. The two inorganic layers 31 in the encapsulation layer 30 can cover the first block portion 20 and the second block portion 50 to increase a path of water and oxygen eroding the inside of the display panel, so as to improve the encapsulation effect of the display panel. FIGS. 1A and 1B only illustrate a part of the block portions in the peripheral region 12 on one side of the display region 11. In the case where the peripheral region 12 surrounds the display region 11, both of the block portions can be provided as a ring surrounding the display region 11, to prevent a material of the organic layer from overflowing around.

As shown in FIGS. 1A and 1B, in the Y direction, the first block portion 20 includes a first block layer 21, a second block layer 22, and a third block layer 23 stacked in sequence, and the second block portion 50 includes a fourth block layer 51 and a fifth block layer 52 stacked in sequence. The first block layer 21 can be formed on the same layer as the planarization layer 18 in the display region 11. For example, the first block layer 21 can be a part of the planarization layer, that is, the planarization layer material is patterned to form the planarization layer 18 while the first block layer 21 is formed. The second block layer 22 and the fourth block layer 51 can be formed on the same layer as the pixel definition layer 19. For example, the second block layer 22 and the fourth block layer 51 can be a part of the pixel definition layer 19, that is, the pixel definition layer material is patterned to form the pixel definition layer 19 while the second block layer 22 of the first block portion 20 and the fourth block layer 51 of the second block portion 50 are formed. The third block layer 23 and the fifth block layer 52 can be formed by patterning the same material layer. Thus, in the Y direction, a height of the first block portion 20 is greater than a height of the second block portion 50, so that the material of the organic layer can be blocked by the first block portion when the material overflows from the second block portion.

As shown in FIGS. 1A and 1B, the display panel further includes a touch layer on a side of the encapsulation layer 30 away from the base substrate 10, the touch layer formed in the display region 11 is a touch electrode, the touch layer formed in the peripheral region 12 is a touch signal line 40, and the touch signal line 40 is electrically connected with the touch electrode to transmit a signal. The touch signal line 40 extends in the X direction, a part of the block portion extends in the Y direction, and an extending direction of the touch signal line 40 intersects with an extending direction of a part of the block portion. The touch layer shown in FIGS. 1A and 1B can be in direct contact with the encapsulation layer 30 (that is, on cell type), that is, the touch layer is patterned to directly form on the surface of the encapsulation layer 30. But it is not limited thereto, a buffer layer can also be provided between the touch layer and the encapsulation layer. Compared with a display panel with an external touch layer, a touch layer substrate is omitted in the display panel shown in FIG. 1B, which can reduce costs and improve integration so that the display panel is thinner and easier to fold.

In the research, the inventor of the present application found that: as shown in FIGS. 1A and 1B, a height of the first block portion 20 is relatively high (for example, 3-6 microns) in the Y direction perpendicular to the base substrate 10, so that the encapsulation layer 30 on the first block portion 20 has a large altitude difference. Thus, during patterning and forming the touch signal line 40 on the surface of the encapsulation layer 30, because of the large altitude difference H1 at an edge of the first block portion 20, metal material remains in the corner region 24 (that is, the edge region 24 of the first block portion 20 in the X direction) of the encapsulation layer 30. The metal material remaining in the corner region 24 of the first block portion 20 may cause the adjacent touch signal lines 40 to be electrically connected to form defects. It should be noted that a shape of a part of the film layers (for example, the film layer included in the first block portion 20 and the film layer included in the second block portion 50, etc.) in the cross-section diagram shown in FIG. 1B is a rectangular shape only for illustration. In the actual process, during curing the second block layer and the third block layer in high temperature, the two block layers will flow in a certain extent, so that the cross-section shape of respective block layers can be approximately trapezoidal, the second block layer covers a surface of the first block layer away from the base substrate and a side face of the first block layer, and the third block layer covers a surface of the second block layer away from the base substrate and a side face of the second block layer. That is, the cross-section shape of the above-mentioned film layers can be trapezoid, and the encapsulation layer 30 has an inclined surface in the corner region 24, and an included angle between the inclined surface and the base substrate is in the range of 40° to 45°. Thus, the metal material easily remains in the corner region 24 of the touch signal line 40.

The embodiments of the present disclosure provide a display panel, a manufacturing method thereof, and a display device. The display panel includes: a base substrate, a first block portion, an encapsulation layer, and a plurality of touch signal lines. The base substrate includes a display region and a peripheral region located in a periphery of the display region; the first block portion is located in the peripheral region, and a first part of the first block portion located on a side of the display region extends in a first direction parallel to the base substrate, and the first block portion includes a first block layer, a second block layer on a side of the first block layer away from the base substrate, and a third block layer on a side of the second block layer away from the first block layer; the second block layer covers a surface of the first block layer away from the base substrate and a side face of the first block layer, and the third block layer covers a surface of the second block layer away from the base substrate and a side face of the second block layer. The encapsulation layer is located in the display region and the peripheral region, and covers the first block portion; the plurality of touch signal lines are located on a side of the encapsulation layer away from the base substrate and extend in a second direction intersecting with the first direction, and an orthographic projection of the plurality of touch signal lines on the base substrate overlaps with an orthographic projection of the first part of the first block portion on the base substrate. The first block layer includes a first sub-block portion and a second sub-block portion with a same material, the second sub-block portion is located between the first sub-block portion and the second block layer; in the first part of the first block portion, a maximum size of the second sub-block portion in the second direction is not greater than a minimum size of the first sub-block portion in the second direction, so that an inclination angle of a first slope formed on a surface of the encapsulation layer away from a junction position of the first sub-block portion and the second sub-block portion is approximately in a range from 20° to 35°. In the embodiments of the present disclosure, the first sub-block portion and the second sub-block portion with different sizes are formed in the first block layer, to form the first slope with the inclination angle in a range from 20° to 35° in the corner region of the encapsulation layer, so as to reduce the slope angle of the touch signal lines located at the edge of the first blocking part, thereby reducing the probability of short circuit between adjacent touch signal lines and improving the yield of the display panel.

The following describes the display panel, the manufacturing method thereof, and the display device according to the embodiments of the present disclosure with reference to the accompanying drawings.

Figure 2A:
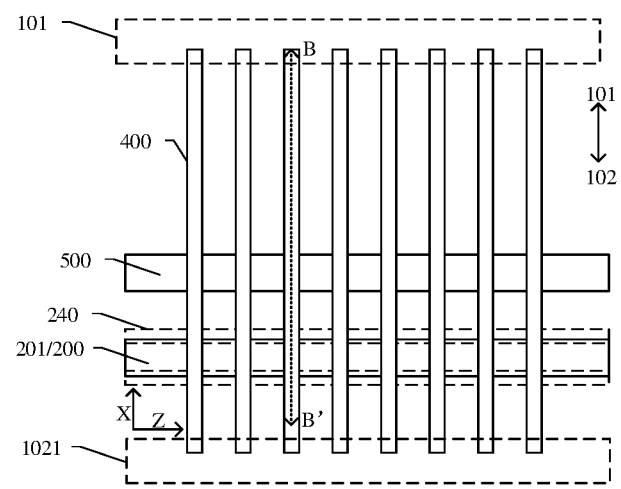
FIG. 2A is a schematic diagram of a partial plane structure of a display panel according to an example of an embodiment of the present disclosure.
Figure 2B:
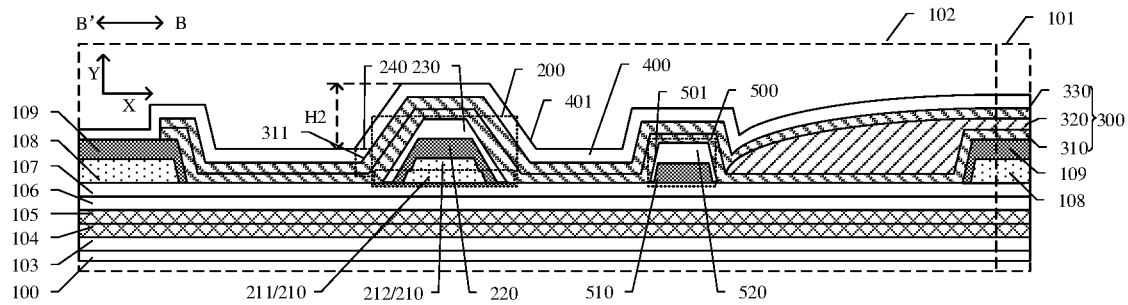
FIG. 2B is a schematic diagram of a cross-section structure taken along a line BB' in FIG. 2A.

FIG. 2A is a schematic diagram of a partial plane structure of a display panel according to an embodiment of the present disclosure, and FIG. 2B is a schematic diagram cross-section structure taken along a line BB' in FIG. 2A. As shown in FIGS. 2A and 2B, the display panel includes a base substrate 100, a first block portion 200 on the base substrate 100, an encapsulation layer 300 on a side of the first block portion 200 away from the base substrate 100, and a plurality of touch signal lines 400 on a side of the layer 300 away from the base substrate 100. The base substrate 100 includes a display region 101 and a peripheral region 102 at a periphery of the display region 101.

FIG. 2B illustrates that the touch signal line 400 is in contact with a surface of the encapsulation layer 300 away from the base substrate 100, but it is not limited thereto. A buffer layer (not shown) can be provided between the touch signal line and the encapsulation layer.

For example, the display region 101 is an image display region of the display panel, that is, a light-emitting region; the peripheral region 102 is the region where the display panel does not display images, that is, a non-light-emitting region. The peripheral region 102 can surround the display region 101, or can be located at a part of the periphery of the display region 101. FIG. 2 illustrates a cross-section diagram of a part of the film layer in the peripheral region 102 on a side of the display region 101.

For example, the base substrate 100 can be a flexible base substrate 100, such as polyimide (PI), to form a flexible display device. A material of the flexible base substrate 100 is not limited to polyimide.

As shown in FIGS. 2A and 2B, the first block portion 200 is located in the peripheral region 102, and the first block portion 200 includes a first block layer 210 and a second block layer 220 that are stacked, and the second block layer 220 is located on a side of the first block layer 210 away from the base substrate 100. FIG. 2B illustrates that the second block layer 220 covers a surface of the first block layer 210 away from the base substrate 100 and a side face of the first block layer 210, and the third block layer 230 covers a surface of the second block layer 220 away from the first block layer 210 and a side face of the second block layer 220. The embodiment of the present disclosure illustrates an example in which the first block layer 210 is a film layer closest to the base substrate 100 in the first block portion 200. The embodiments of the present disclosure are not limited thereto. The first block layer, the second block layer, and the third block layer can be stacked in a direction perpendicular to the base substrate, and in the first part of the first block portion, a maximum size of the second block layer in the second direction is not greater than a minimum size of the second sub-block portion in the second direction, and a maximum size of the third block layer in the second direction is not greater than a minimum size of the second block layer in the second direction.

FIGS. 2A and 2B illustrate the first block portion 200 in the peripheral region 102 on a side of the display region 101, that is, FIGS. 2A and 2B illustrate a first part 201 of the first block portion 200, and the first part 201 extends in a first direction (i.e., the Z direction) parallel to the base substrate 100.

In some examples, as shown in FIG. 2A, the peripheral region 102 includes a bonding region 1021, and the first part 201 of the first block portion 200 is located on a side of the display region 101 close to the bonding region 1021, that is, the first part 201 of the first block portion 200 is located between the display region 101 and the bonding region 1021. The touch signal line 400 is located on a side of the display region 101 close to the bonding region 1021, and thus the first block portion 200 in a region where the touch signal line 400 is located overlaps with the touch signal line 400.

For example, the bonding region 1021 can include a circuit structure (not shown) to be connected with signal lines such as the touch signal line 400.

As shown in FIGS. 2A and 2B, the first block layer 210 includes a first sub-block portion 211 and a second sub-block portion 212 which are made of the same material and stacked, and the second sub-block portion 212 is located between the first sub-block portion 211 and the second block layer 220. In the first part 201 of the first block portion 210, in the second direction intersecting with the first direction (that is, an extending direction of the touch signal line 400 mentioned later, such as the X direction), a maximum size of the second sub-block portion 212 is not greater than a minimum size of the first sub-block portion 211.

In the example shown in FIG. 2B, in the second direction, the maximum size of the second sub-block portion 212 is smaller than the minimum size of the first sub-block portion 211 to form a step structure.

It should be noted that FIG. 2B illustrates an example in which a cross-section shape of the first sub-block portion 211 and the second sub-block portion 212 taken by the XY plane is a standard trapezoid, and then in the X direction, a long side of the second sub-block portion 212 is smaller than a short side of the first sub-block portion 211 to form a step structure. For example, an orthographic projection of the second sub-block portion 212 on the base substrate 100 completely falls within an orthographic projection of the first sub-block portion 211 on the base substrate 100, and in the second direction, two side edges of the orthographic projection of the first sub-block portion 211 on the base substrate 100 are located outside two side edges of the second sub-block portion 212 on the base substrate 100. In the actual process, during curing the two sub-block portions at high temperature, both the two sub-block portions will flow in a certain extent, resulting in shapes of the cross-sections of the two sub-block portions may be approximately trapezoidal (for example, the included angle is a rounded angle).

As shown in FIGS. 2A and 2B, the encapsulation layer 300 is located in the display region 101 and the peripheral region 102, and covers the first block portion 200. The encapsulation layer 300 covers a surface of the first block portion 200 away from the base substrate 100 and a side face of the first block portion 200. The maximum size of the second sub-block portion 212 is smaller than the minimum size of the first sub-block portion 211 in the second direction, a step structure is formed. Therefore, a first slope 311 is formed on a surface of the encapsulation layer 300 at the junction position of the first sub-block portion 211 and the second sub-block portion 212 and away from the base substrate 100, and the inclination angle of the first slope 311 is approximately in a range from 20° to 35°. That is, the inclination angle of the first slope 311 formed on the surface of the encapsulation layer 300 away from the junction position of the first sub-block portion 211 and the second sub-block portion 212 is approximately in the range from 20° to 35°. The encapsulation layer 300 has the first slope 311 with the inclination angle in the range from 20° to 35° at a corner region 240 corresponding to the junction position of the first sub-block portion 211 and the second sub-block portion 212.

For example, the inclination angle of the first slope 311 can be approximately in the range from 25° to 35°. For example, the inclination angle of the first slope 311 formed on the surface of the encapsulation layer 300 away from the junction position of the first sub-block portion 211 and the second sub-block portion 212 is approximately in the range from 27° to 33°. For example, the inclination angle of the first slope 311 can be about 30°.

The example shown in FIG. 2B illustrates that the cross-section of the encapsulation layer taken by the XY plane includes an oblique side, and the inclination angle of the first slope is the included angle between the oblique side of the encapsulation layer and the base substrate.

For example, the embodiment of the present disclosure illustrates an example in which the first block layer includes two sub-block portions which have different sizes and are stacked, but it is not limited thereto. The first block layer can also include more sub-block portions which have different sizes and are stacked, to form more step structures, so that the included angle between the slope formed at the position of the encapsulation layer corresponding to the first block layer and the base substrate is smaller.

For example, as shown in FIG. 2B, the peripheral region 102 of the display panel can include a base substrate 100, and a buffer layer 103, a first gate insulation layer 104, a second gate insulation layer 105, an interlayer insulation layer 106, a source-drain metal layer 107, a planarization layer 108, and a pixel definition layer 109 on the base substrate 100 in sequence. For example, at least one of the planarization layer 108 and the pixel definition layer 109 can be formed by an organic material.

The source-drain metal layer 107 described above corresponds to a source electrode and a drain electrode of a thin film transistor (not shown) included in the pixel circuit structure layer and the data line in the display region 101. The planarization layer 108 in the display region 101 is provided on the thin film transistor, and a light-emitting element (not shown) is disposed on a side of the planarization layer 108 in the display region 101 away from the base substrate 100. The light-emitting element includes, for example, an organic light-emitting diode, but it is not limited thereto.

For example, the light-emitting element can include a light-emitting layer, and a first electrode and a second electrode on both sides of the light-emitting layer. The first electrode on a side of the light-emitting layer close to the base substrate 100 can be electrically connected to the drain electrode of the thin film transistor through a via hole provided in the planarization layer 108. The pixel definition layer 109 is provided on a side of the first electrode away from the base substrate 100 to facilitate forming the light-emitting layer. The encapsulation layer 300 is provided on a side of the light-emitting element away from the base substrate 100. For example, the encapsulation layer 300 can be a planar film. The encapsulation layer is configured to cover the light-emitting element to prevent the light-emitting element from being corroded by external water and oxygen, so as to protect the light-emitting element. FIG. 2B illustrates that the encapsulation layer 300 includes a first inorganic layer 310, an organic layer 320, and a second inorganic layer 330 stacked in sequence, but it is not limited thereto, and can be arranged as required. A material of the inorganic layers in the encapsulation layer includes, for example, silicon nitride, silicon oxide, or silicon oxynitride. The inorganic material has high compactness and can prevent water, oxygen, etc. from entering the light-emitting element to affect the performance of the light-emitting element. The material of the organic layer includes, for example, a polymer resin (for example, polyimide, polyacrylate, etc.), and the organic layer has the functions of planarization and stress relaxation.

For example, as shown in FIGS. 2A and 2B, the first block portion 200 and the second block portion 500 provided in the peripheral region 102 can be located on the source-drain metal layer 107 to prevent a material of the organic layer 320 in the encapsulation layer 300 from overflowing from the base substrate 100 during the manufacture process. The two inorganic layers in the encapsulation layer 300 can cover the first block portion 200 and the second block portion 500 to increase the path of water and oxygen eroding the inside of the display panel, so as to improve the encapsulation effect of the display panel. FIGS. 2A and 2B only illustrate a part of the block portion in the peripheral region 102 on one side of the display region 101. In the case where the peripheral region 102 surrounds the display region 101, both of the block portions can be arranged as a ring structure surrounding the display region 101, to prevent the organic layer material from overflowing around.

As shown in FIGS. 2A and 2B, a plurality of touch signal lines 400 are further provided on a surface of the encapsulation layer 300 in the peripheral region 102 away from the base substrate 100. The touch signal lines 400 can be in contact with a surface of the encapsulation layer 300, and extend in the second direction. An insulation layer can also be provided between the touch signal lines 400 and the encapsulation layer 300, which is not limited in the embodiment of the present disclosure. The touch signal line 400 is provided to cross a part of the first block portion 200 extending in the first direction. The part of the first block portion extending in the first direction refers to the part overlapping the touch signal lines, and the first direction is a direction that intersects with the extending direction of the touch signal lines.

For example, touch electrodes (not shown) are further provided on a surface of the encapsulation layer 300 in the display region 101 away from the base substrate 100, and the touch signal lines 400 are electrically connected to the touch electrodes to transmit signals.

For example, the touch electrode can include a metal grid, and the metal grid includes a plurality of first touch electrodes and a plurality of second touch electrodes. The plurality of first touch electrodes and the plurality of second touch electrodes can form capacitors at the overlapping positions. Upon the touch electrode being touched by a finger, the coupling of the capacitors close to the touch point is affected, thus changing the capacitance of the capacitor close the touch point. Therefore, the touch position can be determined by using this change of the capacitance. The embodiments of the present disclosure are not limited thereto. For example, the touch layer can include a mutual-capacitive touch structure or a self-capacitive touch structure. In addition, the touch layer can also be made of materials such as nano silver wires.

For example, one of the first touch electrode and the second touch electrode can be patterned and formed on the surface of the encapsulation layer.

The touch electrodes and the touch signal lines 400 in the embodiments shown in FIGS. 2A and 2B, for example, are in direct contact with the surface of the encapsulation layer 300 (that is, on cell type), that is, the touch signal lines 400 are directly patterned and formed on the surface of the encapsulation layer 300. Compared with the display panel with an external touch layer, the base material of the touch layer is omitted in the display panel according to the embodiments of the present disclosure, which may not only reduce the cost, but also improve the integration, so that the display panel is lighter, thinner and easier to fold. Of course, compared with the display panel with an external touch layer, in the case where an insulation layer is provided between the touch electrodes and the encapsulation layer, and between the touch signal line and the encapsulation layer, the cost can also be reduced, and the integration can be improved so that the display panel is lighter, thinner and easier to fold.

As shown in FIGS. 2A and 2B, an orthographic projection of the plurality of touch signal lines 400 on the base substrate 100 overlaps with an orthographic projection of the first part 201 of the first block portion 200 extending in the first direction on the base substrate 100. The touch signal line 400 covers the step formed by the first sub-block portion 211 and the second sub-block portion 212, that is, the touch signal line 400 covers a part of the first slope 311 of the encapsulation layer 300 formed at the junction position of the first sub-block portion 211 and the second sub-block portion 212, to form a second slope 401 on the surface of the touch signal line 400 away from the first slope 311. For example, the inclination angle of the second slope 401 can be substantially equal to the inclination angle of the first slope 311. The first slope and the second slope (and the third slope mentioned later) herein are not necessarily an oblique plane, and can be concave or convex with a certain curvature, as long as a film layer at the corners of the junction position of the first sub-block portion and the second sub-block portion can form a smooth surface.

In the embodiments of the present disclosure, at least one step structure is formed in the first block layer of the first block portion closest to the base substrate, so that the encapsulation layer can have a first slope with an inclination angle approximately in a range from 20° to 35° at the position corresponding to the first block layer. Thus, with respect to the first block layer without the step structure shown in FIGS. 1A and 1B, a part of the touch signal line patterned on the encapsulation layer which covers the edge region of the first block portion (where the slope of the encapsulation layer is located) is more gentle, to reduce the probability of forming the residual metal during manufacturing touch signal lines so as to improve the yield. Here, the "approximately in a range from 20° to 35°" refers to that the numerical range can be from 95% of a minimum value (20°) to 105% of a maximum value (35°), and the "approximately" for the subsequent numerical range refers to that the numerical range can be from 95% of a minimum value to 105% of a maximum value.

In some examples, the first sub-block portion 211 and the second sub-block portion 212 are integrally formed, that is, the first sub-block portion 211 and the second sub-block portion 212 are integrally formed by patterning the first block layer material in one-step patterning to save process. Of course, the embodiments of the present disclosure are not limited thereto, and the first sub-block portion 211 and the second sub-block portion 212 can also be two independent structures formed by patterning the first block layer material separately.

In some examples, in the third direction (Y direction) perpendicular to the base substrate 100, a size of the first block layer 210 can be approximately in a range from 1.6 to 2.5 microns.

In some examples, in the third direction, a ratio of a size of the first sub-block portion 211 to a size of the second sub-block portion 212 can be approximately in a range from 0.8 to 1.2.

For example, in the third direction, the size of the first sub-block portion 211 is the same as the size of the second sub-block portion 212.

In some examples, in the second direction, the size of the first sub-block portion 211 is approximately in a range from 25 microns to 45 microns. The difference between the size of the first sub-block portion 211 and the size of the second sub-block portion 212 in the second direction can be 20%-30% of the size of the first sub-block portion 211. Because the size of the first block layer in the X direction may not be too large, the difference between the size of the first sub-block portion and the size of the second sub-block portion is designed to be 20% to 30% of the size of the first sub-block 211 to prevent the first block layer to affect its surrounding structure.

For example, in the second direction, the size of the first sub-block portion 211 can be 40 microns, and the difference between the size of the first sub-block portion 211 and the size of the second sub-block portion 212 is in a range from 5 to 10 microns.

For example, in the case where the size of the first block layer 210 in FIG. 2B in the direction perpendicular to the base substrate 100 is designed to be the same as the size of the first block layer 21 in the display panel shown in FIG. 1B in the direction perpendicular to the base substrate 10, and the size of the second sub-block portion 212 shown in FIG. 2B in the second direction is designed to be the same as the size of the first block layer 21 in the display panel shown in FIG. 1B in the second direction, a size relationship of the first sub-block portion 211 and the second sub-block portion 212 in the first block layer 210 in the second direction and the third direction is adjusted to adjust the angle of the first slope 311 of the encapsulation layer 300 corresponding to the first block layer 210, so as to prevent the touch signal line 400 on the first slope 311 from being short-circuited due to the residual metal material.

In addition, compared to the solution that the size of the first block layer 21 shown in FIG. 1B in the second direction is designed to be the size of the first sub-block portion 211 shown in FIG. 2B in the second direction so that the first block layer 21 and the second block layer 22 in FIG. 1B form the step structure, in the embodiment of the present disclosure, the first block layer is designed to include the first sub-block portion and the second sub-block portion with different sizes so that the first block layer itself forms the step structure which enables the inclination angle of the slope of the encapsulation layer to be smaller, to further facilitate improving the yield of the touch signal line.

For example, in the case where the cross-section of the first block layer 21 in FIG. 1B has a shape of trapezoid, the encapsulation layer 30 corresponding to the first block layer 21 can also have a slope, but the included angle between the slope and the base substrate 10 is relatively large, for example, greater than 40°, so that the touch signal line formed on the slope will have residual metal to cause defects. In the embodiments of the present disclosure, two sub-block portions with different sizes in the first block layer are formed, so that the angle of the slope of the encapsulation layer can be smaller and the slope of the encapsulation layer can be more gentle, to reduce the residual metal material from patterning the touch signal lines formed on the slope.

As shown in FIG. 2B, in an example of the embodiment of the present disclosure, in the first part 201 of the first block 200, the second block layer 220 covers the surface of the first block layer 210 away from the base substrate 100 and the side face of the first block layer 210. But it is not limited thereto. For example, the maximum size of the second block layer 220 in the second direction cannot be greater than the minimum size of the second sub-block portion 212 in the second direction. The cross-section of the second block layer 220 and the second sub-block portion 212 may have a shape of trapezoidal, and the size of the long side of the second block layer is not greater than the size of the short side of the second sub-block portion. For example, upon the maximum size of the second block layer being equal to the minimum size of the second sub-block portion, the surface of the second block layer facing the second sub-block portion completely coincides with the surface of the second sub-block portion facing the second block layer.

For example, in the second direction, the maximum size of the second block layer 220 can be smaller than the minimum size of the second sub-block portion 212 to form a step structure. In the embodiments of the present disclosure, the number of steps in the first block portion can be increased, so that the slope of the encapsulation layer formed at the edge of the first block portion is more gentle, so as to further prevent the touch signal line from being short-circuited.

In some examples, as shown in FIG. 2B, a center line of an orthographic projection of the second sub-block portion 212 on the base substrate 100 in the first direction is approximately coincident with a center line of an orthographic projection of the first sub-block portion 211 on the base substrate 100 in the first direction. That is, in the second direction, an orthographic projection of the second sub-block portion 212 on the first sub-block portion 211 is located in the middle of the first sub-block portion 211. For example, the cross-section of the first block layer 210 approximately has a shape of "convex". As a result, a step structure can be formed on both sides of the first block layer in the second direction, effectively preventing the touch signal lines on both sides of the first block layer from being defective.

In some examples, as shown in FIG. 2B, the center line of the orthographic projection of the second block layer 220 on the base substrate 100 in the first direction is approximately coincident with the center line of the orthographic projection of the second sub-block portion 212 on the base substrate 100 in the first direction.

For example, upon the size of the second block layer 220 in the second direction being smaller than the size of the second sub-block portion 212 in the second direction, the orthographic projection of the second block layer 220 on the second sub-block portion 212 is located in the middle of the second sub-block portion 212 in the second direction, so that steps can be formed on both sides of the second block layer 220 and the second sub-block portion 212 in the second direction, to further prevent the touch signal line covering the first block portion from being defective.

In some examples, as shown in FIG. 2B, the first block portion 200 further includes a third block layer 230 on a side of the second block layer 220 away from the first block layer 210. In an example of the embodiment of the present disclosure, in the first part 201 of the first block 200, the third block layer 230 covers the surface of the second block layer 220 away from the base substrate 100 and the side face of the second block layer 220. Embodiments of the present disclosure are not limited thereto. For example, the maximum size of the third block layer 230 in the second direction may not be greater than the minimum size of the second block layer 220 in the second direction.

For example, the cross-section shape of the second block layer 220 and the third block layer 230 may be trapezoidal, and the size of the long side of the third block layer is not greater than the size of the short side of the second block layer. For example, upon the maximum size of the third block layer being equal to the minimum size of the second block layer, the surface of the third block layer facing the second block layer completely coincides with the surface of the second block layer facing the third block layer.

For example, in the second direction, the maximum size of the third block layer 230 can be smaller than the minimum size of the second block layer 220 to form a step structure. In the embodiments of the present disclosure, the number of steps in the first block portion can be increased, so that the encapsulation layer formed at the edge of the first block portion is more gentle, so as to further prevent the plurality of touch signal lines formed by patterning from having residual metal to cause short-circuit.

In some examples, as shown in FIG. 2B, in the third direction, the size of the first block portion 200 is approximately in a range from 3 microns to 6 microns. For example, as shown in FIG. 2B, in the third direction, the size of the first block portion 200 is approximately in a range from 4.5 microns to 5 microns. As shown in FIG. 2B, in the third direction, the size of the first block portion 200 is about 4 microns.

Compared with the display panel shown in FIG. 1B, in the display panel according to the embodiment of the present disclosure, in the case where the size of the first block portion in the direction perpendicular to the base substrate keeps unchanged (that is, in the display panel according to the embodiment of the present disclosure, the altitude difference H2 of the touch signal line 400 located at the edge of the first block portion 200 is equal to the altitude difference H1 of the touch signal line 40 located at the edge of the first block portion 20 shown in FIG. 1B), at least two sub-block portions with different sizes are formed in the block layer to form a step structure, to reduce the inclination angle of the slope of the encapsulation layer at the edge of the first block portion, so as to further improve the yield of the touch signal line.

In some examples, as shown in FIGS. 2A and 2B, the display panel further includes a second block portion 500. The second block portion 500 is located in the peripheral region 102 and located between the first block portion 200 and the display region 101. The second block portion 500 and the first block portion 200 extend in the same direction. For example, in the peripheral region 102 shown in FIG. 2A, the second block portion 500 extends in the first direction.

In some examples, as shown in FIG. 2B, a surface of the second block portion 500 facing the base substrate 100 and a surface of the first block portion 200 facing the base substrate 100 are on the same plane parallel to the base substrate 100. That is, the surface of the second block portion 500 facing the base substrate 100 is flush with the surface of the first block portion 200 facing the base substrate 100.

In some examples, as shown in FIG. 2B, in the third direction, the size of the first block portion 200 is greater than the size of the second block portion 500 so that the first block portion can block the material of the organic layer in the encapsulation layer assuming that it overflows from the second block portion.

For example, in the third direction, the size of the first block portion 200 is greater than the size of the second block portion 500 by about 2 micrometers. A height of the second block portion is not high, which substantially does not cause the touch signal line on the second block portion to have a large altitude difference, and then the touch signal line on the second block portion is not prone to defects. Of course, in order to avoid defects in the touch signal line on the second block portion, a step structure can also be formed in the second block portion.

For example, the cross-section of the second block portion 500 taken by a plane perpendicular to the extending direction of the second block portion 500 includes a second oblique side 501, and an absolute value of a difference between a second included angle between the second oblique side 501 and the base substrate 100, and the inclination angle of the first slope 311 is greater than 0° and less than 20°.

In the display panel shown in FIG. 1B, in the case where the cross-section of the first block portion and the cross-section of the second block portion both have a shape of trapezoidal, the angles between the oblique sides of them and the base substrate are equal. In the example shown in FIG. 2B, the thickness of the second block portion is relatively thin, it will not have serious affect on the touch signal lines formed thereon, so the second block portion is not adjusted in the forming process, and the inclined angle of the formed oblique side is the same as the angle of the second block portion shown in FIG. 1B, and both are greater than 40°. However, because the size relationship between the first sub-portion and second sub-block portion of the first block portion is adjusted to form a step structure during forming the first sub-block portion and the second sub-block portion, the inclination angle of the first slope of the encapsulation layer formed on the first block portion in this example is significantly smaller than the inclination angle of the slope of the encapsulation layer formed on the second block portion. Therefore, during patterning the touch signal line located on the first block portion, the residual metal is not easy to appear.

For example, upon the peripheral region 102 being provided around the display region 101, the second block portion 500 can be a ring structure around the display region 101.

For example, a distance between the first block portion 200 and the second block portion 500 in the second direction can be approximately in a range from 1.5 microns to 2.5 microns, and the size of the first sub-block portion 211 of the first block layer 210 in the X direction may not be too large to prevent contact with the second block portion 500.

In some examples, as shown in FIG. 2B, the second block portion 500 includes a fourth block layer 510 and a fifth block layer 520 located on a side of the fourth block layer 510 away from the base substrate 100.

For example, as shown in FIG. 2B, in an example of the embodiment of the present disclosure, the cross-sections of the fourth block layer 510 and the fifth block layer 520 are both trapezoidal, and the fifth block layer 520 can cover a surface of the fourth block layer 510 away from the base substrate 100 and a side face of the fourth block layer 510, the embodiment of the present disclosure is not limited thereto. For example, in the second direction, a maximum size of the fifth block layer 520 may not be greater than a minimum size of the fourth block layer 510.

For example, the embodiment of the present disclosure illustrates an example in which the fourth block layer 510 is the film layer of the second block portion 500 closest to the base substrate 100, and a step structure can also be formed in the fourth block layer 510.

For example, in the second direction, the size of the fifth block layer 520 can be smaller than the size of the fourth block layer 510 to form a step structure. The embodiment of the present disclosure is not limited thereto, the size of the fifth block layer in the second direction can also be the same as the size of the fourth block layer in the second direction, so as to facilitate manufacturing.

In some examples, the fourth block layer 510 and the second block layer 220 are provided in the same layer, and the materials and thicknesses of them are the same, that is, the material of the fourth block layer 510 is the same as the material of the second block layer 220, and the thickness of the fourth block layer 510 is the same as the thickness of the second block layer 220. The fifth block layer 520 and the third block layer 230 are provided in the same layer, and materials and thicknesses of them are the same, that is, the material of the fifth block layer 520 is the same as the material of the third block layer 230, and the thickness of the fifth block layer 520 is the same as the thickness of the third block layer 230. That is, the fourth block layer 510 and the second block layer 230 can be two film layers formed of the same material in the same patterning process, and the fifth block layer 520 and the third block layer 230 are also be two film layers formed of the same material in the same patterning process to save process. The "same layer" here and later refers to the relationship between a plurality of film layers formed by the same material in the same step (for example, one patterning process). The "same layer" here does not always mean that the plurality of film layers have the same thickness or that the plurality of film layers have the same height in the cross-section diagram.

For example, the first block layer 210 and the planarization layer 108 are provided in the same layer, and the thickness and material of them are the same. The thickness of the first block layer 210 is the same as the thickness of the planarization layer 108, and the material of the first block layer 210 is the same as the material of the planarization layer 108. The first block layer 210 can be formed in the same layer as the planarization layer 108. For example, the first block layer 210 can be a part of the planarization layer 108, that is, the planarization layer material is patterned to form the planarization layer 108 while the first block layer 210 is formed. Because the formed planarization layer is used to planarize the pixel circuit structure layer (such as a film layer such as a thin film transistor) to form a light-emitting element on the planarization layer, the thickness of the planarization layer is relatively thick, for example, 1.6-2.5 microns. Thus, the thickness of the first block layer is relatively thick.

For example, the second block layer 220 and the fourth block layer 510 can be formed in the same layer as the pixel definition layer 109, and the materials and thickness of them are the same. For example, it can be a part of the pixel definition layer 109, that is, the pixel definition layer material is patterned to form the pixel definition layer 109 while the second block layer 220 of the first block portion 200 and the fourth block layer 510 of the second block portion 500 are formed.

Figure 2C:
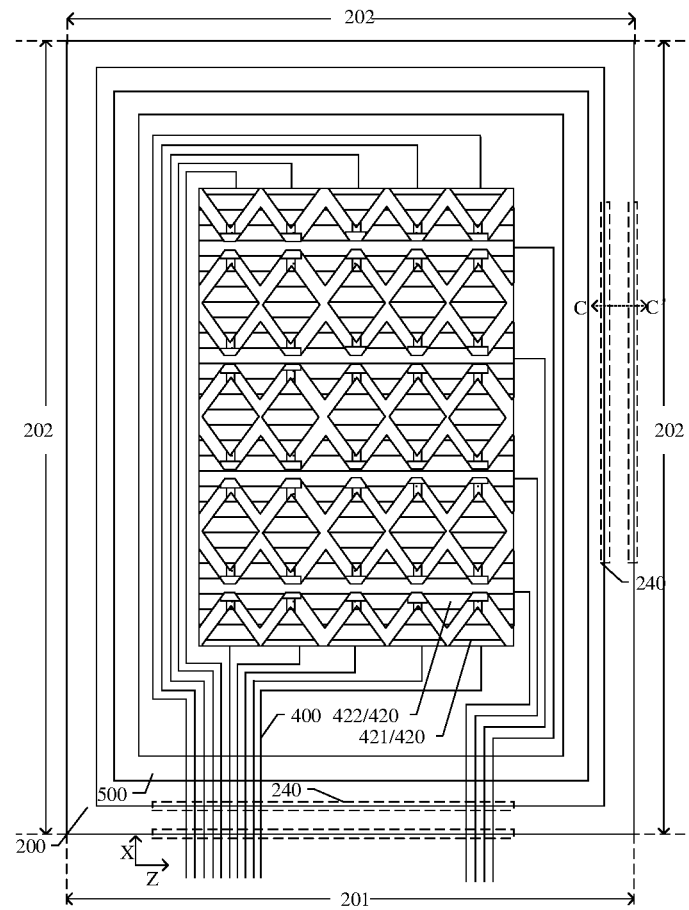
FIG. 2C is a schematic diagram of a partial plane structure of a display panel according to another example of an embodiment of the present disclosure.
Figure 2D:
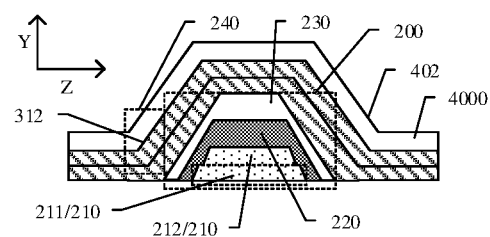
FIG. 2D is a schematic diagram of a cross-section structure taken along a line CC' in FIG. 2C.

FIG. 2C is a schematic diagram of a partial plan structure of a display panel according to another example of an embodiment of the disclosure, and FIG. 2D is a schematic diagram of a cross-section structure taken along line CC' in FIG. 2C. As shown in FIG. 2C, the peripheral region 102 is provided around the display region 101, and the first block portion 200 can be a ring structure surrounding the display region 101. The first block portion 200 includes a first part 201 and a second part 202. The second part 202 is a part other than the first part 201 in the first block portion 200, that is, the first part 201 and the second part 202 form the first block portion 200 having a shape of ring. The embodiment of the present disclosure, illustrates an example in which the display region 101 is a quadrilateral, the first part 201 of the first block portion 200 is a block portion located on one side of the display region 101, and the second part 202 of the first block portion is a block portion surrounding other three sides of the display region 101.

For example, as shown in FIGS. 2C and 2D, a maximum size of the second sub-block portion 212, in a fourth direction intersecting with the extending direction of the second part 202, (FIG. 2C illustrates an example in which the sub-portion of the second part 202 extends in the X direction, and the direction intersecting with the extending direction of the sub-part can be the Z direction) is smaller than a minimum size of the first sub-block portion 211 in the fourth direction so that a third slope 312 is formed at a surface of the encapsulation layer away from a junction position of the first sub-block portion 211 and the second sub-block portion 212. The inclination angle of the third slope 312 is substantially the same as that of the first slope 311 shown in FIG. 2B, that is, the size relationship between the first sub-block portion 211 and the second sub-block portion 212 in the first part 201 of the first block portion 200 and the size relationship between the first sub-block portion 211 and the second sub-block portion 212 in the second part 202 of the first block portion 200 is the same.

For example, the inclination angle of the third slope 312 is approximately in a range from 20° to 35°. For example, the inclination angle of the third slope is approximately in a range from 27° to 33°. For example, the inclination angle of the third slope 312 is about 30°.

For example, the fourth direction is perpendicular to the extending direction of the second part 202.

For example, the film layer 4000 for forming the touch signal line covers a part of the third slope 312 of the encapsulation layer 300 at the junction position of the first sub-block portion 211 and the second sub-block portion 212 so that a fourth slope 402 is formed on a surface of the film layer 4000 away from the third slope 312.

The size of the first sub-block portion and the size of the second sub-block portion in the second part of the first block portion are different, so that the third slope of the encapsulation layer is formed on the surface of the encapsulation layer at a junction position of the first sub-block portion and the second sub-block portion, and then during patterning the film layer deposited on the encapsulation layer to form the touch signal lines, the residual metal is not likely appear at the third slope position. The film layer 4000 on the encapsulation layer shown in FIG. 2D is a film layer for forming touch signal lines. After the touch signal lines are patterned, the film layer will be removed.

Of course, the embodiments of the present disclosure are not limited thereto, and the size relationship between the first sub-block portion and the second sub-block portion in the second part of the first block portion can also be different from the size relationship between the first sub-block portion and the second sub-block portion in the first part of the first block portion. For example, in the second part of the first block portion, the surface of the first sub-block portion facing the second sub-block portion completely coincides with the surface of the second sub-block portion facing the first sub-block portion to facilitate manufacturing.

For example, a touch electrode 420 is further provided on a side of the encapsulation layer 300 located in the display region 101 away from the base substrate 100, and the touch signal line 400 is electrically connected to the touch electrode 420 to transmit signals.

For example, the touch electrode 420 includes a plurality of first touch electrodes 421 and a plurality of second touch electrodes 422, and the first touch electrodes 421 and the second touch electrodes 422 are cross and insulated. The plurality of first touch electrodes 421 extend in the X direction and are arranged in the Z direction; the plurality of second touch electrodes 422 extend in the Z direction and are arranged in the X direction. The plurality of first touch electrodes 421 and the plurality of second touch electrodes 422 are connected to a lead terminal region by the plurality of touch signal lines 400, and the detection of the touch operation and detection of the position where the touch operation occurs can be achieved by applying detection electrical signals to the plurality of touch signal lines 400. For example, both sides of the first touch electrode 421 in the X direction are connected to the touch signal line 400 to achieve both sides driving. Of course, the embodiment of the present disclosure is not limited thereto. The first touch electrode may also be connected to a touch signal line on only one side to realize one-sided driving.

The plurality of first touch electrodes 421 and the plurality of second touch electrodes 422 can form capacitors at overlapping positions. When the touch electrodes are touched by a finger, the coupling of the capacitors near the touch point is affected, thereby changing the capacitance of the capacitors near the touch point. Thus, the touch position can be determined by the change of the capacitance. The embodiments of the present disclosure are not limited thereto. For example, the touch layer can include a mutual-capacitive touch structure or a self-capacitive touch structure. In addition, the touch layer can also be made of materials such as nano silver wires.

For example, one of the first touch electrode and the second touch electrode can be patterned to form on a surface of the encapsulation layer.

In the embodiment shown in FIG. 2C, the touch electrodes and the touch signal lines can be in directly contact with the surface of the encapsulation layer (that is, on cell type), that is, the touch signal lines are directly patterned to form on the encapsulation layer; or an insulation layer can be provided between the touch electrodes and the encapsulation layer, and between the touch signal line and the encapsulation layer. Compared with the display panel with an external touch layer, the base material of the touch layer is omitted in the display panel according to the embodiments of the present disclosure, which may not only reduce the cost, but also improve the integration so that the display panel is lighter, thinner and easier to fold.

Figure 2E:
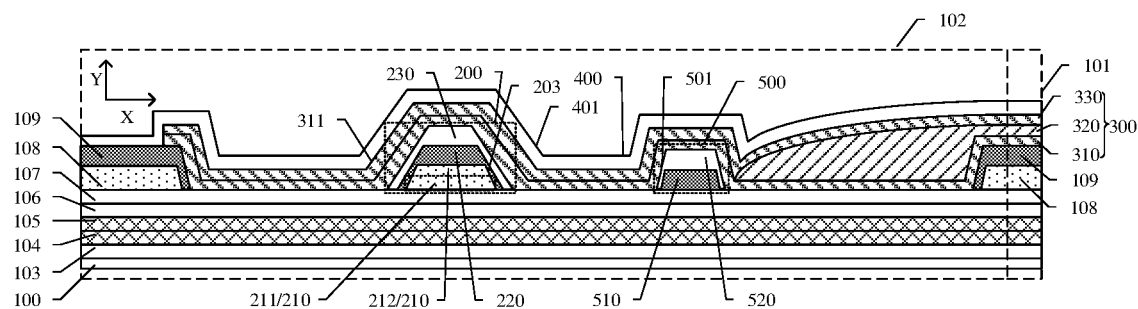
FIG. 2E is a schematic diagram of a partial plane structure of a display panel according to another example of an embodiment of the present disclosure.

For example, FIG. 2E is a schematic diagram of a cross-section structure of a display panel according to another example in an embodiment of the disclosure. The difference between the display panel in the example shown in FIG. 2E and the display panel shown in FIG. 2B is that the cross-section of the first block layer 210 in the first part of the first block portion 200 taken by a plane perpendicular to the first direction has substantially a shape of trapezoidal.

The first included angle between the first oblique side 203 included in the trapezoid and the base substrate 100 is approximately in a range from 20° to 35°. That is, in the first part of the first block portion, the maximum size of the second sub-block portion in the second direction is equal to the minimum size of the first sub-block portion in the second direction, and therefore, the cross-section of the first block has a shape of trapezoidal.

In this example, upon the first sub-block portion and the second sub-block portion being manufactured, the maximum size of the second sub-block portion is smaller than the minimum size of the first sub-block portion, but the materials of the two sub-block portions will flow in a certain extent when curing at a high temperature, so that the cross-sections of the two sub-block portions have a shape of trapezoidal, and the maximum size of the second sub-block portion is equal to the minimum size of the first sub-block portion.

In the case where the cross-section of the first block layer 21 in FIG. 1B has a shape of trapezoid, the included angle between the oblique side of the trapezoid and the base substrate 10 is relatively large, for example, greater than 40°, so that the touch signal line formed on the first block layer has residual metal, to cause defects. Compared with the first block portion shown in FIG. 1B, the first included angle between the first oblique side of the first block layer including the first sub-block portion and the second sub-block portion and the base substrate in this example is approximately in a range from 20° to 35°, so that the angle of the slope of the encapsulation layer can be smaller, and the slope of the encapsulation layer can be more gentle, so as to reduce the residual metal material of the touch signal line patterned on the slope.

For example, the first included angle between the first oblique side 203 and the base substrate 100 is about 25°-35°. For example, the first included angle between the first oblique side 203 and the base substrate 100 is about 30°.

For example, FIG. 2E illustrates that in the first part 201 of the first block portion 200, the second block layer 220 covers the surface of the first block layer 210 away from the base substrate 100 and the side face of the first block layer 210, and the third block layer 230 covers the surface of the second block layer 220 away from the base substrate 100 and the side face of the second block layer 220. But it is not limited thereto. For example, the maximum size of the second block layer 220 in the second direction may not be greater than the minimum size of the second sub-block portion 212 in the second direction, and the maximum size of the third block layer 230 in the second direction may not be greater than the minimum size of the second block layer 220 in the second direction. For example, the maximum size of the second block layer 220 in the second direction is equal to the minimum size of the second sub-block portion 212 in the second direction, and the maximum size of the third block layer 230 in the second direction is equal to the minimum size of the second block layer 220 in the second direction. The embodiments of the present disclosure are not limited thereto.

For example, FIG. 2E illustrates that the fifth block layer 520 covers the surface of the fourth block layer 510 away from the base substrate 100 and the side face of the fourth block layer 510. The embodiments of the present disclosure are not limited thereto. For example, in the second direction, the maximum size of the fifth block layer 520 is not greater than the minimum size of the fourth block layer 510. For example, the maximum size of the fifth block layer 520 can be equal to the minimum size of the fourth block layer 510.

For example, the cross-section of the second block portion 500 taken by a plane perpendicular to the extending direction of the second block portion 500 includes a second oblique side 501, and an absolute value of a difference between the second included angle between the second oblique side 501 and the base substrate 100 and the inclination angle of the first slope 311 is greater than 0° and less than 20°. That is, the absolute value of the difference between the second included angle between the second oblique side 501 and the base substrate 100 and the first included angle between the first oblique side 203 and the base substrate 100 is greater than 0° and less than 20°.

In the display panel shown in FIG. 1B, in the case where the cross-sections of the first block portion and the second block portion both have a shape of trapezoidal, the included angles between the oblique sides of the first block portion and the second block portion and the base substrate are equal. In the example shown in FIG. 2E, the thickness of the second block portion is relatively thin, it will not have serious affect on the touch signal lines formed thereon, so the second block portion is not adjusted during the forming process. The inclined angle of the formed oblique side of the second block portion is the same as the angle of the second block portion shown in FIG. 1B, and both are greater than 40°. However, because the size relationship between the first sub-block portion and second sub-block portion of the first block portion is adjusted during forming the first sub-block portion and the second sub-portion (the size of the second sub-block portion is smaller than the size of the first sub-block portion), the inclination angle of the first oblique side of the cross-section of the first block portion in this example is significantly smaller than the oblique angle of the second oblique side of the cross-section of the second block portion. Therefore, during patterning the touch signal line on the first block portion, the residual metal is not easy to appear.

Figure 2F:
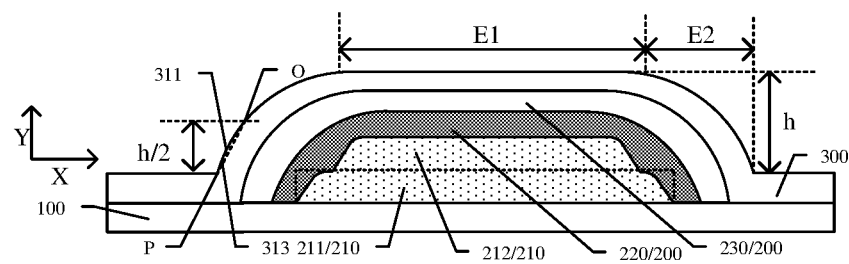
FIG. 2F is a schematic diagram of a partial cross-section structure of a display panel according to another example of an embodiment of the present disclosure.

FIG. 2F is a schematic diagram of a cross-section structure of a display panel according to another example in an embodiment of the present disclosure. The display panel in the example shown in FIG. 2F is different form the display panel shown in FIG. 2B in that in the first part of the first block portion 200, shapes of the cross-sections of the second block layer 220 and the third block layer 230 are not standard trapezoids, and the cross-sections of the two block layers approximately have a shape of trapezoidal. That is, upon the second block layer and the third block layer being formed, because materials of the two block layers will flow in a certain extent during curing at high temperature, the shapes of the cross-sections of the two block layers have rounded corners.

In this example, upon the first sub-block portion and second sub-block portion being formed, the maximum size of the second sub-block is smaller than the minimum size of the first sub-block, but the materials of the two sub-block portions will flow in a certain extent during curing at high temperature, so that the shapes of the cross-sections of the two block layers have rounded corners; or the maximum size of the second sub-block portion is equal to the minimum size of the first sub-block portion, and they have no obvious boundary therebetween.

The second block layer in the structure shown in FIG. 1B covers the surface of the first block layer away from the base substrate and the side face of the first block layer, and the third block layer covers the surface of the second block layer away from the first block layer and the side face of the second block layer. Compared with this structure shown in FIG. 1B, in the embodiment of the present disclosure, two sub-block portions with different sizes are formed in the first block layer, and thus the slope angles of the second block layer and the third block layer formed on the first block layer are smaller, so that the inclination angle of the first slope formed by the surface of the encapsulation layer formed on the third block layer at a position away from the junction position of the first sub-block portion and the second sub-block portion is approximately in a range from 20° to 35°, to reduce the slope angle of the touch signal line located at the edge of the first block portion, so as to further reduce the probability of short-circuit between adjacent touch signal lines to improve the yield of the display panel.

As shown in FIG. 2F, the encapsulation layer 300 covering the first block portion 200 includes a planarization portion E1 and a slope portion E2, and the slope portion E2 includes the first slope 311. The thickness of the encapsulation layer 300 covering the first block portion 200 is h (this thickness does not include the thickness of the planarization portion located outside the first block portion). Upon the first slope of the encapsulation layer 300 is curved, in the embodiment of the present disclosure, taking the gradient of a connecting line 313 between a point O at half the height of the encapsulation layer 300 and the end point P of the slope portion E2 of the encapsulation layer 300 away from the planarization portion E1 as the gradient of the first slope 311 as an example, the included angle between the connecting line 313 and the plane where the substrate 100 is located is the inclination angle of the first slope 311.

Figure 3:
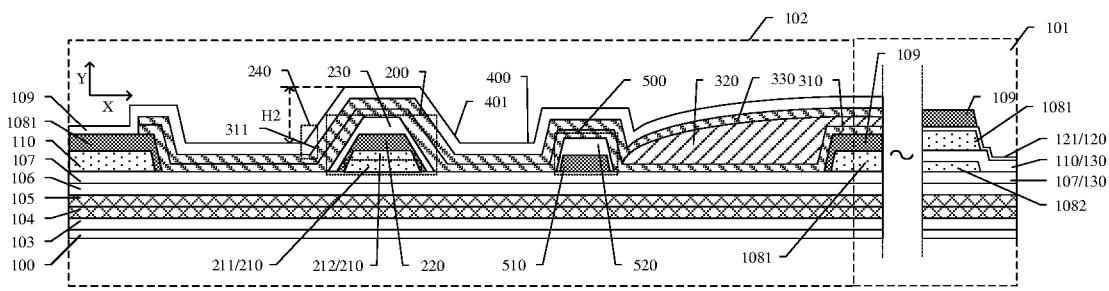
FIG. 3 is a schematic diagram of a partial cross-section structure of a display panel according to another example of an embodiment of the present disclosure.

FIG. 3 is a schematic diagram of a partial cross-section structure of a display panel provided according to another example of an embodiment of the present disclosure. The part of the display region 101 of the display panel shown in FIG. 3 does not show structures such as the encapsulation layer and the touch electrode, and part of the structure is omitted between the dotted lines in the display region 101 in FIG. 3. In addition, the peripheral region of the display panel in FIG. 3 illustrates the structure shown in FIG. 2E as an example, but it is not limited thereto, and can also be the structure shown in FIG. 2B or the structure shown in FIG. 2F. Part of the display region 101 of FIG. 3 illustrates the pixel circuit structure layer 130, the planarization layer 108, and the light-emitting element 120. As shown in FIG. 3, the difference from the display panel shown in FIG. 2B is that the display panel in this example includes a first source-drain metal layer 107 and a second source-drain metal layer 110 (dual SD structure). The first block portion 200 and the second block portion 500 can be formed on the second source-drain metal layer 110.

For example, materials of the above two source-drain metal layers are the same, and both of them can have a titanium-aluminum-titanium structure. The design of the two source-drain metal layers (dual SD structure) can facilitate improving the brightness uniformity of the display panel and reduce the power consumption of the driver IC.

For example, as shown in FIG. 3, the display panel includes a first planarization layer 1081 on a side of the second source-drain metal layer 110 away from the first source-drain metal layer 107, and a second planarization layer 1082 located between the two source-drain metal layers, the two source-drain metal layers are electrically connected in the display region 101. The two source-drain metal layers herein are configured as data signal lines, and the design of electrical connection between two data signal lines on different layers can reduce the spacing between the lines.

For example, as shown in FIG. 3, a first electrode 121 of a light-emitting element is further provided on the side of the pixel definition layer 109 in the display region 101 facing the base substrate 100, and the first electrode 121 is electrically connected to the second source-drain metal layer 110.

Figure 4A:
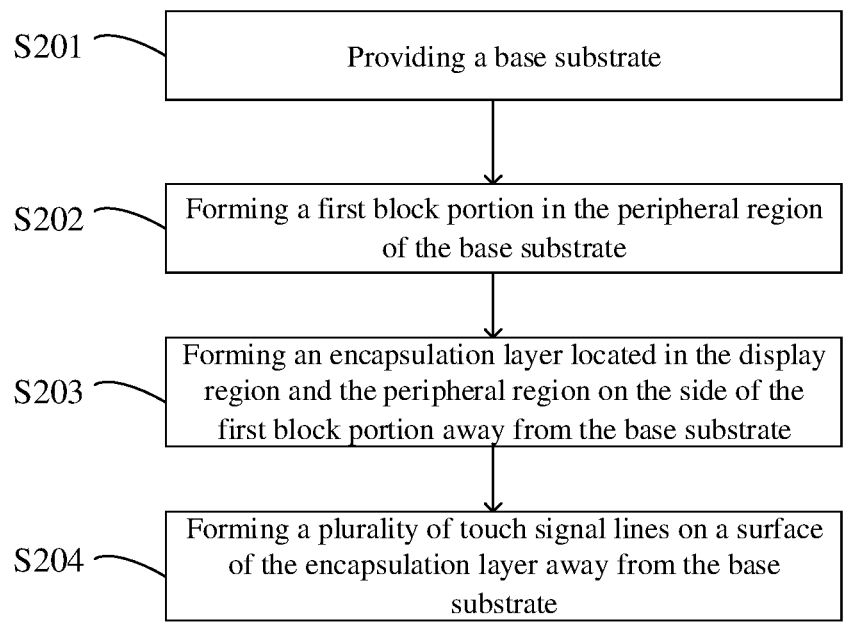
FIG. 4A is a schematic flowchart of a manufacturing method of a display panel according to an embodiment of the present disclosure.
Figure 4B:
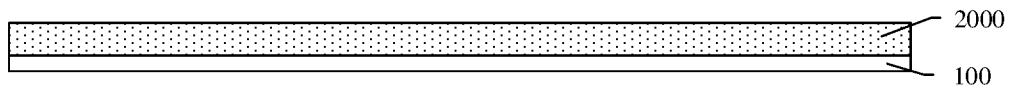
FIGS. 4B and 4C are schematic process flow diagrams of forming a first block layer.
Figure 4C:
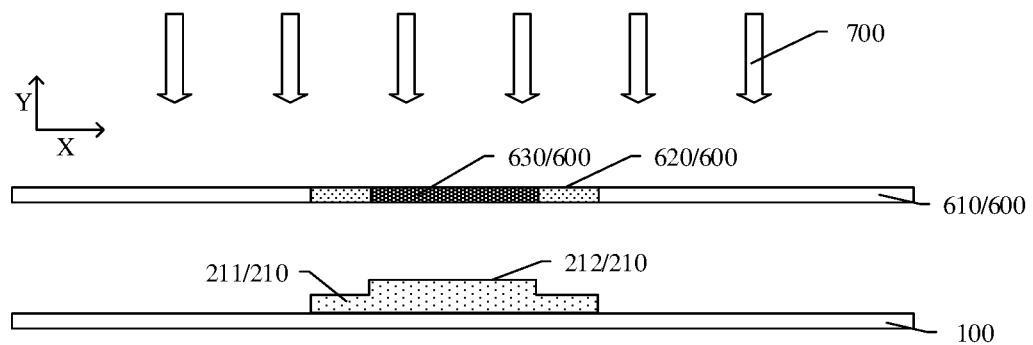

Another embodiment of the present disclosure provides a manufacturing method of a display panel. FIG. 4A is a schematic flow chart of a manufacturing method of a display panel according to an embodiment of the disclosure, and FIGS. 4B and 4C are schematic process flow charts of forming a first block layer. As shown in FIG. 4A, the manufacturing method of the display panel includes the following steps.

S201: providing a base substrate.

For example, the display panel shown in FIG. 3 can be formed by the manufacturing method according to the embodiment of the present disclosure. As shown in FIG. 3, the base substrate 100 includes a display region 101 and a peripheral region 102 located at a periphery of the display region 101.

For example, the base substrate 100 can be a flexible base substrate, such as polyimide (PI), to form a flexible display device. The material of the flexible base substrate 100 is not limited to polyimide.

S202: forming a first block portion in the peripheral region of the base substrate.

For example, as shown in FIG. 3, before forming the first block portion 200, a buffer layer 103, a first gate insulation layer 104, a second gate insulation layer 105, and an interlayer insulation layer 106, a first source-drain metal layer 107, a second planarization layer 1082, a second source-drain metal layer 110, a first planarization layer 1081, a pixel definition layer 109 and other film layers can be formed on the base substrate 100 in sequence.

For example, the part of the first block portion 200 formed in the peripheral region 102 extends in a first direction parallel to the base substrate 100 (a direction perpendicular to the X direction shown in FIG. 3).

As shown in FIG. 4B, a step of forming the first block portion 200 includes: forming a first block layer material 3100 on the base substrate 100. FIG. 4B only illustrates the base substrate 100 and the first block layer material 3100, and does not illustrate the film layer between the base substrate 100 and the first block layer material 3100.

For example, the first block layer material 3100 can include organic materials, such as materials including one or a combination of polyimide, polyamide, polycarbonate, epoxy, etc., or photoresist materials, etc.

As shown in FIG. 4C, one patterning process is performed on the first block layer material to form a first sub-block portion 211 and a second sub-block portion 212 which are stacked so as to form a film layer (first block layer 210) on the side of the first block portion 200 closest to the base substrate 100.

As shown in FIG. 4C, in some examples, a step of forming the first sub-block portion 211 and the second sub-block portion 212 which are stacked by the one patterning process includes: forming the first sub-block portion 211 and the second sub-block portion 212 by a halftone mask 600. In addition, the second sub-block portion 212 is formed on the side of the first sub-block portion 211 away from the base substrate 100, and in the second direction (X direction) intersecting with the first direction, the maximum size of the second sub-block portion 212 is smaller than the minimum size of the first sub-block portion 211 to form a step structure. FIG. 4C illustrates that the cross-sections of the first sub-block portion and the second sub-block portion have a shape of rectangle. In the actual process, the cross-sections of the two sub-block portions can both have a shape of trapezoidal.

As shown in FIG. 4C, in some examples, the half-tone mask 600 includes a completely light-transmitting region 610, a partial light-transmitting region 620, and a non-light-transmitting region 630. The step of forming the first sub-block portion 211 and the second sub-block portion 212 includes: placing the non-light-transmitting region 630 of the half-tone mask 600 directly opposite to the region where the second sub-block portion 212 is to be formed in the first block layer material, and placing the partial light-transmitting region 620 of the half-tone mask 600 directly opposite to the region to form a portion of the first sub-block portion 211 other than a portion overlapping with the region to form the second sub-block portion 212, and placing the completely light-transmitting region 610 of the half-tone mask 600 directly opposite to the region other than the region to form the first sub-block portion 211, and then exposing the first block layer material by the laser 700. That is, the completely exposure region is formed at a position where the first block layer 210 is not required, and the partial exposure region is formed at a position where the first block layer 210 with a thinner thickness is formed (that is, the position of the first sub-block 211 other than the portion overlapping with the second sub-block 212), and the position where the first block layer 210 with the thicker thickness (that is, the second sub-block portion 212) is formed is not exposed. The first block layer material 3100 is then developed and cured to form the first sub-block portion 211 and the second sub-block portion 212. This example takes an example that a material of the first block layer includes a positive photoresist for description, this example is not limited thereto. For example, a material of the first block layer can include a negative photoresist. Upon a negative photoresist material being used as the layer material, the positions of the completely light-transmitting region and the non-light-transmitting region of the half-tone mask are interchanged.

For example, in the case where the size relationships of the first sub-block portion and the second sub-block portion in the first part and the second part of the first block portion in the embodiment of the present disclosure are the same, the above method of forming the first sub-block portion and the second sub-block portion by the half-tone mask is applicable to form respective positions of the first block portion. In the embodiment of the present disclosure, in the case where the size relationship between the first sub-block portion and the second sub-block portion in the second part of the first block portion is different from the size relationship between the first sub-block portion and the second sub-block portion in the first part of the first block portion, for example, upon the surface of the first sub-block portion facing the second sub-block portion being coincident with the surface of the second sub-block portion facing the first sub-block portion, the above method of forming the first sub-block portion and the second sub-block portion by the half-tone mask is only applicable to the first part of the first block portion.

For example, as shown in FIG. 4C, the first sub-block portion 211 and the second sub-block portion 212 are an integrated structure formed by patterning the first block layer material 3100 in one step, thereby saving process. The region where the first sub-block portion 211 and the second sub-block portion 212 overlap is the region where the thickness of the first block layer 210 is large, and the region where only the first sub-block portion 211 is provided is the region where the thickness of the first block layer 210 is small. Therefore, the first block layer is a film layer with two different thicknesses. The embodiments of the present disclosure illustrates that the first block layer only have two different thicknesses, but it is not limited thereto, and the first block layer can also have more different thicknesses to form more step structures.

For example, the first block layer 210 can be formed in the same layer as the first planarization layer 1081, for example, the first block layer 210 can be a part of the first planarization layer 1081, that is, the first planarization layer material is patterned to form the first planarization layer 1081 while the first block layer 210 is formed. Upon the first planarization layer being formed, the position to form the first planarization layer can be directly opposite to the non-light-transmitting region of the halftone mask so that the thickness of the formed planarization layer is the same as the larger thickness of the first block layer (the sum of the thickness of the sub-block portion and the second sub-block portion), the embodiment of the present disclosure is not limited thereto, and the position to form the first planarization layer can also be directly opposite to the partial light-transmitting region of the halftone mask so that the thickness of the formed planarization layer is the same as the thickness of the first sub-block portion.

As shown in FIG. 3, after forming the first block layer 210, the step of forming the first block portion 200 further includes: forming a second block layer 220 on the side of the second sub-block portion 212 away from the base substrate 100. For example, upon the second block layer being patterned and formed, in the second direction, the maximum size of the second block layer may not be greater than the minimum size of the second sub-block portion. In the actual process, the material of the formed second block layer will flow in a certain extent during the high-temperature curing process, so that the cross-section of the second block layer can have a shape of trapezoidal, and the second block layer covers the surface of the first block layer away from the base substrate, and the side face of the first block layer. Of course, the embodiments of the present disclosure are not limited thereto. Upon the size of the second block layer in the direction parallel to the base substrate being small, the maximum size of the second block layer may not be greater than the minimum size of the second sub-block portion. For example, upon the maximum size of the second block layer being equal to the minimum size of the second sub-block portion, the surface of the second block layer facing the second sub-block portion is coincident with the surface of the second sub-block portion facing the second block layer. For example, in the second direction, the maximum size of the second block layer can be smaller than the minimum size of the second sub-block portion to form a step structure.

For example, as shown in FIG. 3, the second block layer 220 can be formed in the same layer as the pixel definition layer 109, for example, the second block layer can be a part of the pixel definition layer 109, that is, the pixel definition layer material is patterned to form the pixel definition layer 109, while the second block layer 220 of the first block portion 200 is formed.

For example, as shown in FIG. 3, the step of forming the first block portion 200 further includes: forming a third block layer 230 on the side of the second block layer 220 away from the first block layer 210. For example, the material of the third block layer 230 can be an organic layer, which has a function of supporting subsequent film layers.

For example, upon the third block layer being patterned and formed, in the second direction, the maximum size of the third block layer can be not greater than the minimum size of the second block layer. In the actual process, the material of the formed third block layer will flow in a certain extent during the high-temperature curing process, so that the shape of the cross-section of the third block layer may be trapezoidal, and the third block layer covers the surface of the second block layer away from the base substrate and the side face of the second block layer. Of course, the embodiments of the present disclosure are not limited thereto. Upon the size of the third block layer in the direction parallel to the base substrate being small, the maximum size of the third block layer may not be greater than the minimum size of the second block layer.

For example, as shown in FIG. 3, the second block portion 500 can be formed while the first block portion 200 is formed. The second block portion 500 is formed in the peripheral region 102 and is located on a side of the first block portion 200 close to the display region 101. The second block portion 500 and the first block portion 200 extend in the same direction.

For example, as shown in FIG. 3, the step of forming the second block 500 includes forming a fourth block layer 510 and a fifth block layer 520 on the base substrate 100 in sequence.

For example, the fourth block layer 510 can be formed in the same layer as the second block layer 220 and the pixel definition layer 109, for example, the fourth block layer can be a part of the pixel definition layer 109, that is, the pixel definition layer material is patterned to form the pixel definition layer 109 while the second block layer 220 of the first block portion 200 and the fourth block layer 510 of the second block portion 500 are formed.

For example, the fifth block layer 520 and the third block layer 230 can be formed by patterning the same material using the same mask to save process.

S203: forming an encapsulation layer located in the display region and the peripheral region on the side of the first block portion away from the base substrate.

For example, as shown in FIG. 3, the encapsulation layer 300 covers the first block portion 200 to form the first slope 311 on a surface of the encapsulation layer 300 at the junction position of the first sub-block portion 211 and the second sub-block portion 212 and away from the base substrate. In the embodiment of the present disclosure, at least one step structure is formed in the first block layer of the first block portion closest to the base substrate, and thus the encapsulation layer can form a slope at a position corresponding to the first block layer.

For example, as shown in FIG. 3, forming the encapsulation layer 300 can include forming a first inorganic layer 310, an organic layer 320, and a second inorganic layer 330 stacked in sequence. The embodiment of the present disclosure is not limited thereto, as long as the organic layer and the inorganic layer are alternately formed.

For example, the material of the inorganic layer in the encapsulation layer 300 includes silicon nitride, silicon oxide, or silicon oxynitride. The inorganic material has high compactness and can prevent water, oxygen, etc. from entering and affecting the performance of the light-emitting element. The material of the organic layer includes, for example, polymer resins, such as polyimide, polyacrylate, etc., and the organic layer has the functions of planarization and stress relaxation.

S204: forming a plurality of touch signal lines on a surface of the encapsulation layer away from the base substrate.

For example, after the encapsulation layer is formed, the touch layer material can be directly formed on the surface of the encapsulation layer, and then the touch layer material can be patterned to form touch electrodes located in the display region and touch signal lines located in the peripheral region. That is, the touch signal line is directly patterned and formed on the surface of the encapsulation layer.

For example, as shown in FIG. 3, the plurality of touch signal lines 400 extend in a direction intersecting with the X direction, and thus, the plurality of touch signal lines 400 cover the part of the first block portion 200 extending in the first direction. The touch signal line 400 covers the first sub-block portion 211 and the second sub-block portion 212, that is, the touch signal line 400 covers the first slope 311 of the encapsulation layer 300 having an inclination angle approximately in a range from 20° to 35° at the junction position of the first sub-block portion 211 and the second sub-block portion 212.

In the embodiments of the present disclosure, at least one step structure is formed in the first block layer of the first block portion closest to the base substrate, so that the encapsulation layer can have an inclination angle approximately in a range from 20° to 35° at the position corresponding to the first block layer. Thus, compared to the first block layer without a step structure shown in FIGS. 1A and 1B, a part of the touch signal line directly patterned and formed on the encapsulation layer which covers the edge region of the first block portion (where the slope of the encapsulation layer is located) is more gentle, to reduce the probability of forming residual metal during manufacturing the touch signal lines so as to improve the yield.

Another embodiment of the present disclosure provides a display device including the display panel provided in any of the above examples. In the display device according to the embodiments of the present disclosure, at least one step structure is formed in the first block layer of the first block portion closest to the base substrate, so that the encapsulation layer can have a slope at the position corresponding to the first block layer, to reduce the probability of forming residual metal during manufacturing touch signal lines, so as to improve the yield.

The following statements should be noted:

(1) The accompanying drawings involve only the structure(s) in connection with the embodiment(s) of the present disclosure, and other structure(s) can be referred to common design(s).

(2) In case of no conflict, features in one embodiment or in different embodiments can be combined.

What are described above is related to the illustrative embodiments of the disclosure only and not limitative to the scope of the disclosure; the scopes of the disclosure are defined by the accompanying claims.

What is claimed is:

1. A display panel, comprising:
   a base substrate, comprising a display region and a peripheral region located at a periphery of the display region;
   a first block portion, located in the peripheral region, and a first part of the first block portion located on a side of the display region extending in a first direction parallel to the base substrate, and the first block portion comprising a first block layer, a second block layer located on a side of the first block layer away from the base substrate, and a third block layer located on a side of the second block layer away from the first block layer; the second block layer covering a surface of the first block layer away from the base substrate and a side face of the first block layer, and the third block layer covering a surface of the second block layer away from the base substrate;
   an encapsulation layer, located in the display region and the peripheral region, and covering the first block portion;
   a plurality of touch signal lines, located on a side of the encapsulation layer away from the base substrate and extending in a second direction intersecting with the first direction, and an orthographic projection of the plurality of touch signal lines on the base substrate overlapping with an orthographic projection of the first part of the first block portion on the base substrate,
   wherein the first block layer comprises a first sub-block portion and a second sub-block portion with a same material, and the second sub-block portion is located between the first sub-block portion and the second block layer, and the first sub-block portion and the second sub-block portion are integrally formed,
   in the first part of the first block portion, a maximum size of the second sub-block portion in the second direction is not greater than a minimum size of the first sub-block portion in the second direction, so that an inclination angle of a first slope of the encapsulation layer formed on a side surface of the first block portion is approximately in a range from 20° to 35°.

2. The display panel according to claim 1, wherein the inclination angle of the first slope is approximately in a range from 27° to 33°.

3. The display panel according to claim 1, wherein a cross-section of the first block layer in the first part of the first block portion taken by a plane perpendicular to the first direction has a shape of trapezoid, and a first included angle between a first oblique side included in the trapezoid and the base substrate is approximately in a range from 20° to 35°.

4. The display panel according to claim 1, wherein the peripheral region comprises a bonding region, and the first part of the first block portion is located on a side of the display region close to the bonding region.

5. The display panel according to claim 1, wherein the plurality of touch signal lines cover a part of the first slope so that a surface of the plurality of touch signal lines away from the first slope forms a second slope.

6. The display panel according to claim 5, wherein the first block portion is a ring structure surrounding the display region, and in a second part of the first block portion except the first part, a maximum size of the second sub-block portion in a fourth direction intersecting with an extending direction of the second part is not greater than a minimum size of the first sub-block portion in the fourth direction, so that a third slope is formed on a surface of the encapsulation layer away from the junction position of the first sub-block portion and the second sub-block portion, and an inclination angle of the third slope is approximately in a range from 20° to 35°.

7. The display panel according to claim 1, wherein in the first part of the first block portion, a center line of an orthographic projection of the second sub-block portion on the base substrate in the first direction is substantially coincident with a center line of an orthographic projection of the first sub-block portion on the base substrate in the first direction.

8. The display panel according to claim 7, wherein a center line of an orthographic projection of the second block layer on the base substrate in the first direction is substantially coincident with the center line of the second sub-block portion.

9. The display panel according to claim 1, further comprising:

a second block portion, located in the peripheral region and located between the first block portion and the display region, the second block portion and the first block portion extend in a same direction, and in a third direction perpendicular to the base substrate, a size of the first block portion is greater than a size of the second block portion.

10. The display panel according to claim 9, wherein a cross-section of the second block portion taken by a plane perpendicular to the extending direction of the second block portion comprises a second oblique side, and an absolute value of a difference between a second included angle between the second oblique side and the base substrate, and the inclination angle of the first slope, is greater than 0° and less than 20°.

11. The display panel according to claim 9, wherein the second block portion comprises a fourth block layer and a fifth block layer located on a side of the fourth block layer away from the base substrate, the fourth block layer and the second block layer are provided in a same layer and have a same material and a same thickness, and the fifth block layer and the third block layer are provided in a same layer and have a same material and a same thickness.

12. The display panel according to claim 11, further comprising:
a pixel circuit structure layer, located in the display region;
a planarization layer, located on a side of the pixel circuit structure layer away from the base substrate; and
a light-emitting element, located on a side of the planarization layer away from the pixel circuit structure layer,
wherein the first block layer and the planarization layer are provided in a same layer, and have a same material.

13. The display panel according to claim 12, further comprising:
a pixel definition layer, located on a side of the planarization layer away from the pixel circuit structure layer,
wherein the second block layer and the pixel defining layer are provided in a same layer, and have a same material.

14. The display panel according to claim 1, wherein, in a third direction perpendicular to the base substrate, a ratio of a size of the first sub-block portion to a size of the second sub-block portion is approximately in a range from 0.8 to 1.2.

15. The display panel according to claim 1, wherein a size of the first sub-block portion in the second direction is approximately in a range from 25 microns to 45 microns.

16. The display panel according to claim 15, wherein, in the second direction, a difference between the size of the first sub-block portion and the size of the second sub-block portion is 20%~30% of the size of the first sub-block portion.

17. A manufacturing method of a display panel, comprising:
providing a base substrate, the base substrate comprising a display region and a peripheral region located at a periphery of the display region;
forming a first block portion in the peripheral region of the base substrate, wherein a first part of the first block portion extends in a first direction parallel to the base substrate, forming the first part of the first block portion comprises: forming a first block layer material on the base substrate; forming a first sub-block portion and a second sub-block portion which are stacked by performing one patterning process on the first block layer material, the second sub-block portion being located on a side of the first sub-block portion away from the base substrate, and in a second direction intersecting with the first direction, a maximum size of the second sub-block portion being not greater than a minimum size of the first sub-block portion; forming a second block layer on a side of the second sub-block portion away from the base substrate; forming a third block layer on a side of the second block portion away from the first block portion;
forming an encapsulation layer located in the display region and the peripheral region on a side of the first block portion away from the base substrate, the encapsulation layer covering the first part of the first block portion to form a first slope on a side surface of the first block portion, and an inclination angle of the first slope being approximately in a range from 20° to 35°; and
forming a plurality of touch signal lines extending in the second direction on a surface of the encapsulation layer away from the base substrate, the plurality of touch signal lines covering a part of the first slope.

18. The manufacturing method according to claim 17, wherein forming the first sub-block portion and the second sub-block portion which are stacked by performing the one patterning process comprises: forming the first sub-block portion and the second sub-block portion by a half-tone mask.

19. A display device, comprising the display panel according to claim 1.

20. A display panel, comprising:
a base substrate, comprising a display region and a peripheral region located at a periphery of the display region;
a first block portion, located in the peripheral region, and a first part of the first block portion located on a side of the display region extending in a first direction parallel to the base substrate, and the first block portion comprising a first block layer, a second block layer located on a side of the first block layer away from the base substrate, and a third block layer located on a side of the second block layer away from the first block layer; the second block layer covering a surface of the first block layer away from the base substrate and a side face of the first block layer, and the third block layer covering a surface of the second block layer away from the base substrate;
an encapsulation layer, located in the display region and the peripheral region, and covering the first block portion;
a plurality of touch signal lines, located on a side of the encapsulation layer away from the base substrate and extending in a second direction intersecting with the first direction, and an orthographic projection of the plurality of touch signal lines on the base substrate overlapping with an orthographic projection of the first part of the first block portion on the base substrate,
wherein the first block layer comprises a first sub-block portion and a second sub-block portion with a same material, and the second sub-block portion is located between the first sub-block portion and the second block layer,
in the first part of the first block portion, a maximum size of the second sub-block portion in the second direction is not greater than a minimum size of the first sub-block portion in the second direction, so that an inclination angle of a first slope of the encapsulation layer formed on a side surface of the first block portion is approximately in a range from 20° to 35°, the plurality of touch signal lines cover a part of the first slope so that a surface of the plurality of touch signal lines away from the first slope forms a second slope.

* * * * *